United States Patent
Anderson

(10) Patent No.: US 9,529,747 B2
(45) Date of Patent: Dec. 27, 2016

(54) MEMORY ADDRESS GENERATION FOR DIGITAL SIGNAL PROCESSING

(71) Applicant: Imagination Technologies Limited, Kings Langley (GB)

(72) Inventor: Adrian J Anderson, Chepstow (GB)

(73) Assignee: Imagination Technologies Limited, Kings Langley (GB)

( * ) Notice: Subject to any disclaimer, the term of this patent is extended or adjusted under 35 U.S.C. 154(b) by 98 days.

(21) Appl. No.: 14/012,450

(22) Filed: Aug. 28, 2013

(65) Prior Publication Data

US 2014/0068170 A1    Mar. 6, 2014

(30) Foreign Application Priority Data

Aug. 30, 2012   (GB) .................................... 12154225

(51) Int. Cl.
   G06F 13/28   (2006.01)
   G11C 7/10    (2006.01)
(52) U.S. Cl.
   CPC ............. G06F 13/28 (2013.01); G11C 7/1072 (2013.01)
(58) Field of Classification Search
   CPC .............................. G06F 13/28; G06F 12/1009
   USPC ......................................................... 710/26
   See application file for complete search history.

(56) References Cited

U.S. PATENT DOCUMENTS

| 7,415,550 | B2 | 8/2008 | Tanaka et al. |
| 7,793,191 | B2 | 9/2010 | Takamura |
| 2003/0225958 | A1 | 12/2003 | Efland et al. |
| 2006/0236045 | A1 | 10/2006 | Keyes |
| 2007/0266187 | A1 | 11/2007 | Senoo |
| 2008/0028188 | A1 | 1/2008 | Zhong |
| 2008/0152131 | A1 | 6/2008 | Senoo |
| 2009/0313399 | A1 | 12/2009 | Lingam et al. |
| 2011/0113305 | A1 | 5/2011 | Liu et al. |

FOREIGN PATENT DOCUMENTS

| CN | 1521643 A | 8/2004 |
| CN | 1825292 A | 8/2006 |
| CN | 101118524 A | 2/2008 |

OTHER PUBLICATIONS

Combined Search & Exam Report in GB1215422.5 (Dec. 19, 2012).
Combined Search & Exam Report in GB1215425.8 (Dec. 20, 2012).

*Primary Examiner* — Ernest Unelus
(74) *Attorney, Agent, or Firm* — Vorys, Sater, Seymour and Pease LLP; Vincent M DeLuca

(57) ABSTRACT

Memory address generation for digital signal processing is described. In one example, a digital signal processing system-on-chip utilizes an on-chip memory space that is shared between functional blocks of the system. An on-chip DMA controller comprises an address generator that can generate sequences of read and write memory addresses for data items being transferred between the on-chip memory and a paged memory device, or internally within the system. The address generator is configurable and can generate non-linear sequences for the read and/or write addresses. This enables aspects of interleaving/deinterleaving operations to be performed as part of a data transfer between internal or paged memory. As a result, a dedicated memory for interleaving operations is not required. In further examples, the address generator can be configured to generate read and/or write addresses that take into account limitations of particular memory devices when performing interleaving, such as DRAM.

20 Claims, 5 Drawing Sheets

MEMORY ADDRESS GENERATION FOR DIGITAL SIGNAL PROCESSING

This application claims priority from GB App. No. 1215422.5, filed on Aug. 30, 2012, which is incorporated by reference in its entirety herein for all purposes.

BACKGROUND

Digital signal processing is used in a wide variety of applications. Many of these applications are real-time in the sense that time constraints exist on the processing of the data in order for it to be meaningful or useful to an end user. An example of this is digital broadcast streams, such as digital television and digital radio. The digital signal processing system needs to be capable of processing and decoding the real-time streams rapidly enough to enable the data to be output as quickly as it is received (barring buffering).

Digital signal processing systems often utilise one or more dedicated hardware peripherals in addition to more general purpose digital signal processors. The hardware peripherals are processing blocks that are designed to perform a specific signal processing task in a rapid and efficient manner. For example, interleaving and deinterleaving is an operation that is commonly performed for real-time data using a hardware peripheral. Interleaving and deinterleaving are memory-intensive operations, and the hardware peripherals that perform this utilise an associated dedicated memory device for re-ordering the data.

However, the requirements of different types of real-time data can vary significantly. For example, the various different digital television and radio standards used around the world often have the real-time data structured differently, e.g. using different types or parameters for coding, interleaving, equalisation etc. If the digital signal processing system is to be flexible enough to be used with different standards, then the dedicated memory device used for interleaving/deinterleaving must be sufficiently large to handle the standard with the largest memory demands. As a result, the memory used with an interleaving/deinterleaving hardware peripheral is frequently underutilised.

The embodiments described below are not limited to implementations which solve any or all of the disadvantages of known digital signal processing systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Memory address generation for digital signal processing is described. In one example, a digital signal processing system-on-chip utilises an on-chip memory space that is shared between functional blocks of the system. An on-chip direct memory access (DMA) controller comprises an address generator that can generate sequences of read and write memory addresses for data items being transferred between the on-chip memory and a paged memory device, or internally within the system. The address generator is configurable and can generate non-linear sequences for the read and/or write addresses. This enables aspects of interleaving/deinterleaving operations to be performed as part of a data transfer between internal or paged memory. As a result, a dedicated memory for interleaving operations is not required. In further examples, the address generator can be configured to generate read and/or write addresses that take into account limitations of particular memory devices when performing interleaving, such as DRAM.

A first aspect provides a digital signal processing system-on-chip, comprising: a first memory storing a plurality of data items arranged in a first sequence, each data item having an associated memory address on the first memory; at least one digital signal processor coupled to the first memory and arranged to read and write data directly to the first memory; and a direct memory access controller coupled to the first memory and comprising a port to a paged memory device, wherein the direct memory access controller is configured to transfer the plurality of data items directly from the first memory to the paged memory device, and wherein the direct memory access controller further comprises a configurable address generator arranged to manipulate the memory address associated with each data item during the transfer by using a selected one of a plurality of read modes and a selected one of a plurality of write modes, such that the data items written to the paged memory device are arranged in a second sequence that is different from the first sequence.

A second aspect provides a method of performing an interleaving or deinterleaving operation in a digital signal processing system using a direct memory access controller comprising a configurable address generator, wherein the direct memory access controller is coupled to a memory storing a plurality of data items arranged in a first sequence, each data item having an associated address on the memory, the method comprising: selecting a read mode and a write mode for the address generator; computing, at the address generator, a sequence of memory read addresses according to the read mode, and a sequence of memory write addresses according to the write mode, such that there is a non-linear relationship between the read addresses and the corresponding write addresses; reading, using the direct memory access controller, the data item associated with the first address in the sequence of read addresses; writing, using the direct memory access controller, that data item to the first address in the sequence of write addresses; and repeating the reading and writing for each subsequent address in the sequence of read addresses and write addresses, such that the data items are arranged in a second sequence on the memory that is different from the first sequence.

The methods described herein may be performed by a computer configured with software in machine readable form stored on a tangible storage medium e.g. in the form of a computer program comprising computer program code for configuring a computer to perform the constituent portions of described methods. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

This acknowledges that firmware and software can be valuable, separately tradable commodities. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The above features may be combined as appropriate, as would be apparent to a skilled person, and may be combined with any of the aspects of the examples.

BRIEF DESCRIPTION OF THE DRAWINGS

Embodiments will be described, by way of example, with reference to the following drawings, in which.

Figure 1:
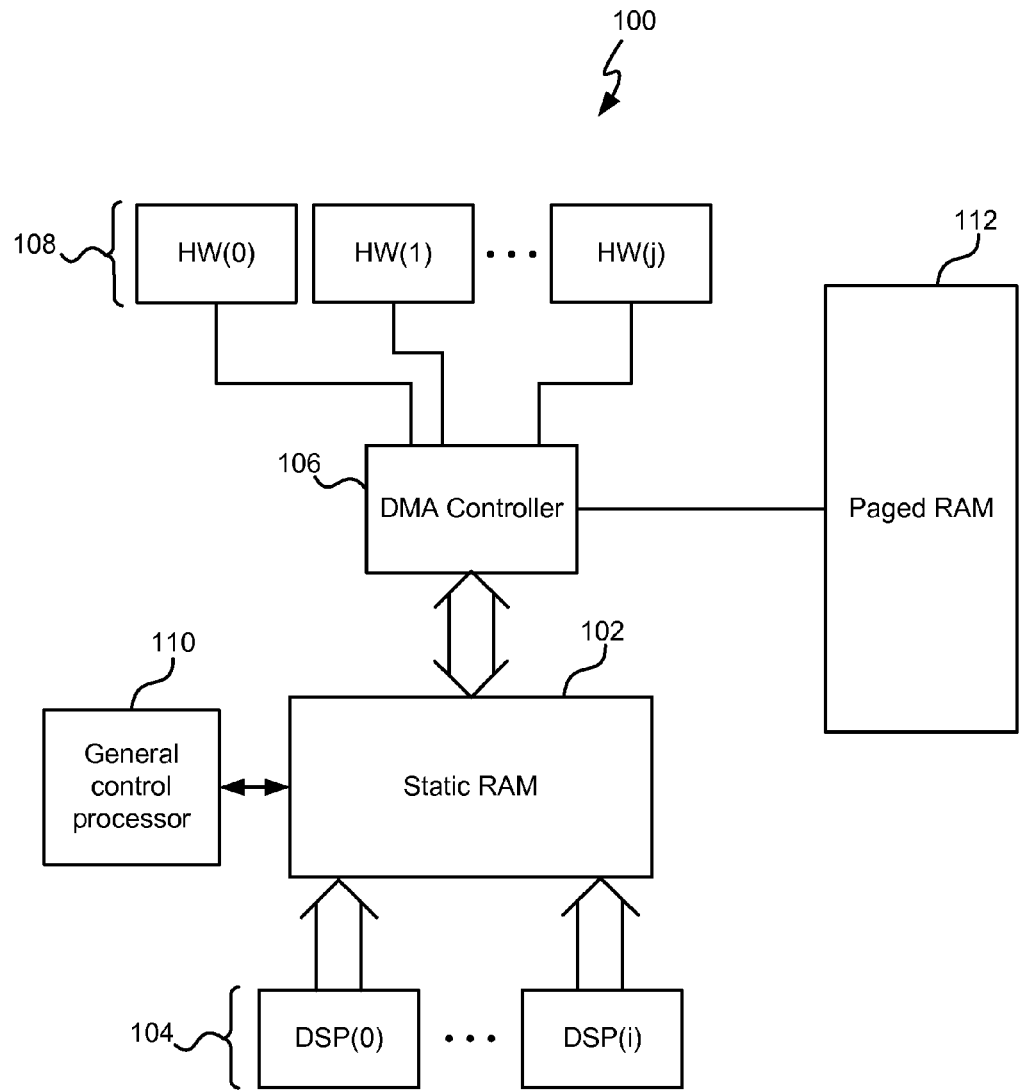
FIG. 1 illustrates a configurable digital signal processing system.

Common reference numerals are used throughout the figures to indicate similar features.

DETAILED DESCRIPTION

Embodiments are described below by way of example only. These examples represent the best ways of putting the embodiments into practice that are currently known to the Applicant although they are not the only ways in which this could be achieved. The description sets forth the functions of the example and the sequence of steps for constructing and operating the example. However, the same or equivalent functions and sequences may be accomplished by different examples.

Described below is a configurable digital signal processing system that makes use of both general purpose digital signal processors as well as specialised hardware peripherals. In order to enable efficient use of memory, the different elements of the system have access to a shared on-chip memory. Data items can be written to or read from the on-chip memory by a direct memory access (DMA) controller. In some examples, the DMA controller can also have a port to another memory device such as a paged memory device.

The term paged memory device is used herein to describe any type of memory device in which it is efficient to read and/or write to a plurality of memory locations within a certain range of memory locations (defining the page) when that range of locations are activated (i.e. that page is open). This is intended to cover, for example, dynamic random access memory (DRAM) and any variants thereof such as synchronous DRAM (SDRAM), and double data rate (DDR) SDRAM, as well as any memory device that is accessed efficiently using bursts of contiguous memory locations.

The DMA controller has a configurable address generator, which can be configured to read and write data items to the on-chip memory (and/or the paged memory device) in accordance with different modes. The different modes allow non-linear (i.e. non-consecutive) sequences of data items to be read from and/or written to the memory. This enables re-ordering operations to be performed on the data items, such as those used in interleaving or deinterleaving. These operations are performed on-the-fly, whilst the data items are being transferred between memory locations or from one memory to another. This avoids the need for a dedicated (non-shared) memory to be included on the digital signal processing system for use with interleaving or deinterleaving, which in turn reduces chip area and cost. The different modes can also be configured to counteract the performance limitations of certain types of memory devices, such as DRAM.

The term 'linear' is used herein in relation to reading/writing sequences of data items, to refer to reading/writing consecutive (or contiguous) data items. In contrast, the term 'non-linear' is used herein in relation to reading/writing sequences of data items, to refer to reading/writing non-consecutive (or non-contiguous) data items and examples of non-linear sequences are described below.

Reference is first made to FIG. 1, which shows the structure of an example configurable digital signal processing system-on-chip 100. The system 100 comprises an on-chip memory 102, which is used for the storage of data items. The on-chip memory 102 can be any suitable form of random access memory (RAM), such as (but not limited to) static RAM (SRAM).

Connected to the on-chip memory 102 are one or more digital signal processors (DSPs) 104. The DSPs 104 are processors that are programmable to perform signal processing calculations on data, such as, for example, fast fourier transforms and equalisation. Whilst not considered general-purpose processors, the DSPs 104 are more configurable than the hardware peripherals described below. The DSPs 104 execute program code/instructions to read data from the on-chip memory 102, perform signal processing operations on the data, and write data back to the on-chip memory 102.

Also connected to the on-chip memory 102 is a DMA controller 106, which provides access to the on-chip memory 102 for a plurality of hardware peripherals 108. The DMA controller 106 provides a plurality of memory access channels (e.g. DMA channels) that can be used by the hardware peripherals 108 to enable the reading or writing of data from or to the on-chip memory 102.

As noted above, the hardware peripherals 108 are specialised, dedicated fixed-function hardware blocks that are configured to perform a particular signal processing task. For example, one hardware peripheral may be a specialised Viterbi decoding block, and another one may be a specialised Reed-Solomon decoding block. The hardware peripherals may also be known as accelerators. Each of the hardware peripherals operates independently of each other. The hardware peripherals may be sufficiently configurable to be provided with operational parameters specific to their task, but they are not sufficiently configurable to change their task (e.g. a Viterbi block cannot be reconfigured as a Reed-Solomon block). Therefore, the hardware peripherals are more specialised to a particular task than the DSPs 104. However, the hardware peripherals are arranged to perform their specialised tasks in a very rapid and efficient manner. Also connected to the on-chip memory 102 is a general control processor 110, which can be used to initialise, configure and control the operation of the digital signal processing system.

The digital signal processing system described above provides flexibility in the signal processing operations. For example, the system can be arranged to operate such that the different DSPs 104 and hardware peripherals 108 process the data in any desired configuration or sequence. Each hardware peripheral or DSP can operate on one or more blocks of data (also referred to herein as buffers of data) provided by other parts of the system and stored in the on-chip memory 102, and generates and stores one or more buffers of data to be used by other elements of the system. This enables the digital signal processing system to be used for a variety of different types of signal, e.g. for different broadcast/telecommunication standards.

The use of a common memory space provided by the on-chip memory 102 enables the total amount of memory storage provisioned in the system-on-chip 100 to be reduced. Without the use of a common memory space, each processing element is provided with its own, dedicated memory. For example, each of the DSPs 104 may have their own workspace memory, the general control processor 110 has another separate memory for storing execution code and data, the hardware peripherals 108 have separate input and output buffers, and one or more additional memories may be used for exchanging data between the processing elements.

Because the digital signal processing system is configurable for use with a number of different standards (i.e. in order to allow different communication standards to be implemented), each of these separate memories need to be separately dimensioned for the particular standard that has the largest demand on any given memory. In other words, the DSP memory needs to be large enough to accommodate the standard that has the largest demands on DSP memory. Similarly, the hardware peripheral buffers need to be large enough to accommodate the standard with the highest demands on hardware peripheral buffers (which may be different to the standard with high DSP memory demands). As a result of this, significant amounts of memory are generally unused by some of the processing elements.

However, if a common memory space is provided by the on-chip memory 102, then the memory requirements of the different standards as a whole can be taken into account (rather than their requirements on individual elements of the system). In other words, the on-chip memory 102 needs to be large enough to accommodate the largest overall, total memory demands of the standards. This has the effect of averaging the differing memory requirements between the standards (e.g. one standard might need more DSP memory, but smaller buffers, whereas another standard may be the opposite). This has the effect of requiring a significantly lower amount of overall memory, and hence saves silicon area.

The common memory space provided by the on-chip memory 102 can therefore hold all the different types of data used by the system, such as digital signal processor workspaces, execution code and data for the general control processor, input and output buffers for one or more of the hardware peripherals, one or more buffers for exchanging data between processors, as well as other configuration data for the digital signal processing system.

FIG. 1 also shows a paged memory device 112 connected to the DMA controller 106. In some examples, the paged memory device 112 is in the form of DRAM, which can provide a large quantity of relatively inexpensive, but volatile storage. The paged memory device 112 may be considered to be external memory in the sense that it may not be formed on the same silicon as the system-on-chip 100, or in some examples the memory device 112 can be a block of embedded DRAM that is formed on the same silicon as the system-on-chip 100 but is still external in the sense that it is not directly accessible by the DSPs. The paged memory device may also form another shared memory space, e.g. storing data relating to the digital signal processing system, as well as MPEG or other video stream-related data.

Figure 2:
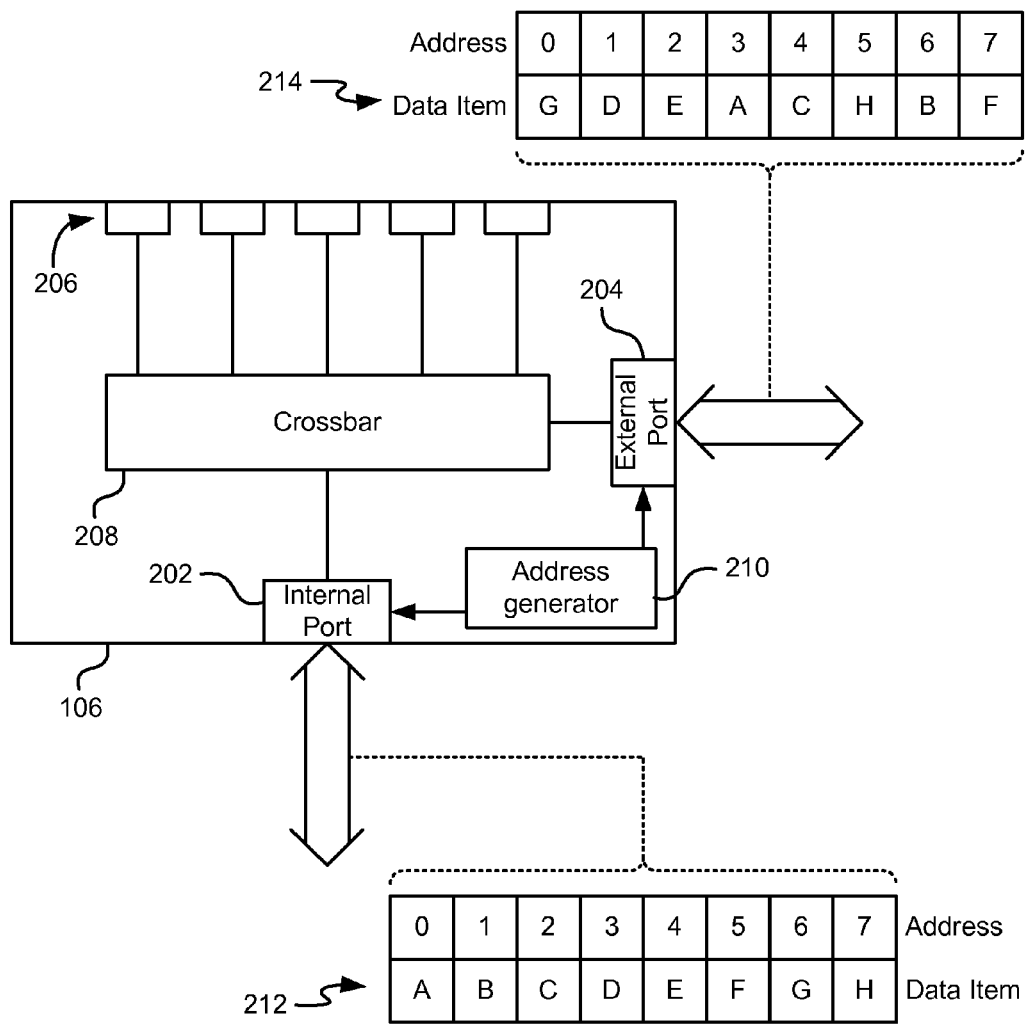
FIG. 2 illustrates a schematic diagram of a DMA controller.

Reference is now made to FIG. 2, which illustrates a schematic diagram of the DMA controller 106. The DMA controller 106 comprises an internal port 202, which is arranged to connect to the on-chip memory 102, and an external port 204 which is arranged to connect to the paged memory device 112. The DMA controller 106 also comprises a plurality of peripheral ports 206, each arranged to connect to an associated hardware peripheral 108. The internal port 202, external port 204, and peripheral ports 206 are all connected to a crossbar 208, which enables any one of these ports to be connected to any other of these ports.

The DMA controller 106 further comprises an address generator 210, which is coupled to both the internal port 202 and external port 204, and is arranged to generate sequences of read and/or write addresses for either or both of the memories connected to the internal port 202 and external port 204. The address generator 210 is configurable, and can be programmed to operate in a number of different modes, examples of which are outlined in more detail below. For example, the general control processor 110 may be arranged to send one or more commands to the address generator 210 in order to select one or more modes of operation for the address generator 210. The general control processor 110 may select the modes by executing a program arranged to configure the address generator in one or more modes in accordance with a desired standard.

By generating sequences of read and/or write addresses, the address generator can perform non-linear reordering of data items stored on a memory connected to one of the ports of the DMA controller 106. For example, FIG. 2 illustrates how a first sequence 212 of data items stored on the on-chip memory 102 can be reordered during a transfer to the paged memory device 112. In the example of FIG. 2, there are eight data items on the on-chip memory 102, which are stored at memory addresses denoted 0 to 7. In other examples, the memory addresses can start from a base address other than zero, and/or each individual data item can be larger than a single memory location on the memory device. In this example, these data items are transferred to the paged memory device, but are ordered in a second sequence 214 that is different to the first sequence 212. For clarity, the data items in the second sequence 214 are stored at memory addresses denoted 0 to 7 on the paged memory device 112, although in other examples these addresses can start from a base address other than zero.

In a first example, the address generator 210 can generate a linear read sequence of [0, 1, 2, 3, 4, 5, 6, 7] and provide this read sequence to the internal port 202. The address generator 210 can also generate a non-linear write sequence of [3, 6, 4, 1, 2, 7, 0, 5] and provide this to the external port 204. This causes the internal port 202 to firstly read the data item from the first address in the read sequence (address 0), which is data item "A" in this example. This data item is passed over the crossbar 208 to the external port 204, which writes this data item to the first memory address in the write sequence (address 3). This results in data item "A" being reordered from being the first data item in the first sequence 212 to being the fourth data item in the second sequence 214. This operation repeats with each subsequent data item addressed in the read sequence, each of which is written to the corresponding address in the write sequence. As a result of this, the data items from the first sequence (denoted A, B, C, D, E, F, G) are now stored on the paged memory in the second sequence (G, D, E, A, C, H, B, F).

In a second example, the same re-ordering of data items can also be achieved by the address generator 210 generating a non-linear read sequence of [6, 3, 4, 0, 2, 7, 1, 5] and a linear write sequence of [0, 1, 2, 3, 4, 5, 6, 7]. In this example, data item "G" is first read from address 6 on the on-chip memory, and written to address 0 on the paged memory, followed by data item "D" read from address 3 on the on-chip memory, and written to address 1 on the paged memory, etc. Similarly, in a third example, the same reordering of data items can also be achieved by the address generator 210 generating a non-linear read sequence and also a non-linear write sequence. One example of this would be a read sequence of [0, 2, 4, 6, 1, 3, 5, 7] and a write sequence of [3, 4, 2, 0, 6, 1, 7, 5].

In each of the above examples, the re-ordering from the first to the second sequence is performed on-the-fly during the direct transfer of data items from the on-chip memory 102 to the paged memory device 112 by the DMA controller 106. Note that the transfer from on-chip memory 102 to the paged memory device 112 is merely an example. In other examples, similar re-ordering operations can also be performed internally to the system-on-chip by transferring the first sequence of data items from one portion of the on-chip memory 102 to another portion of the on-chip memory 102, and manipulating the addresses of the data items during that transfer in order to form the second sequence of data items. Also note that similar operations can also be performed for transfers from the paged memory device 112 to the on-chip memory 102, and also for transfers to or from the hardware peripherals and the on-chip memory 102 or paged memory device 112.

The example above also showed the read and write address sequences being generated in full before performing the transfer. However, this can also be performed concurrently with the transfer, for example by generating one or more read and write addresses as one or more previous data items are being read/written.

Figure 3:
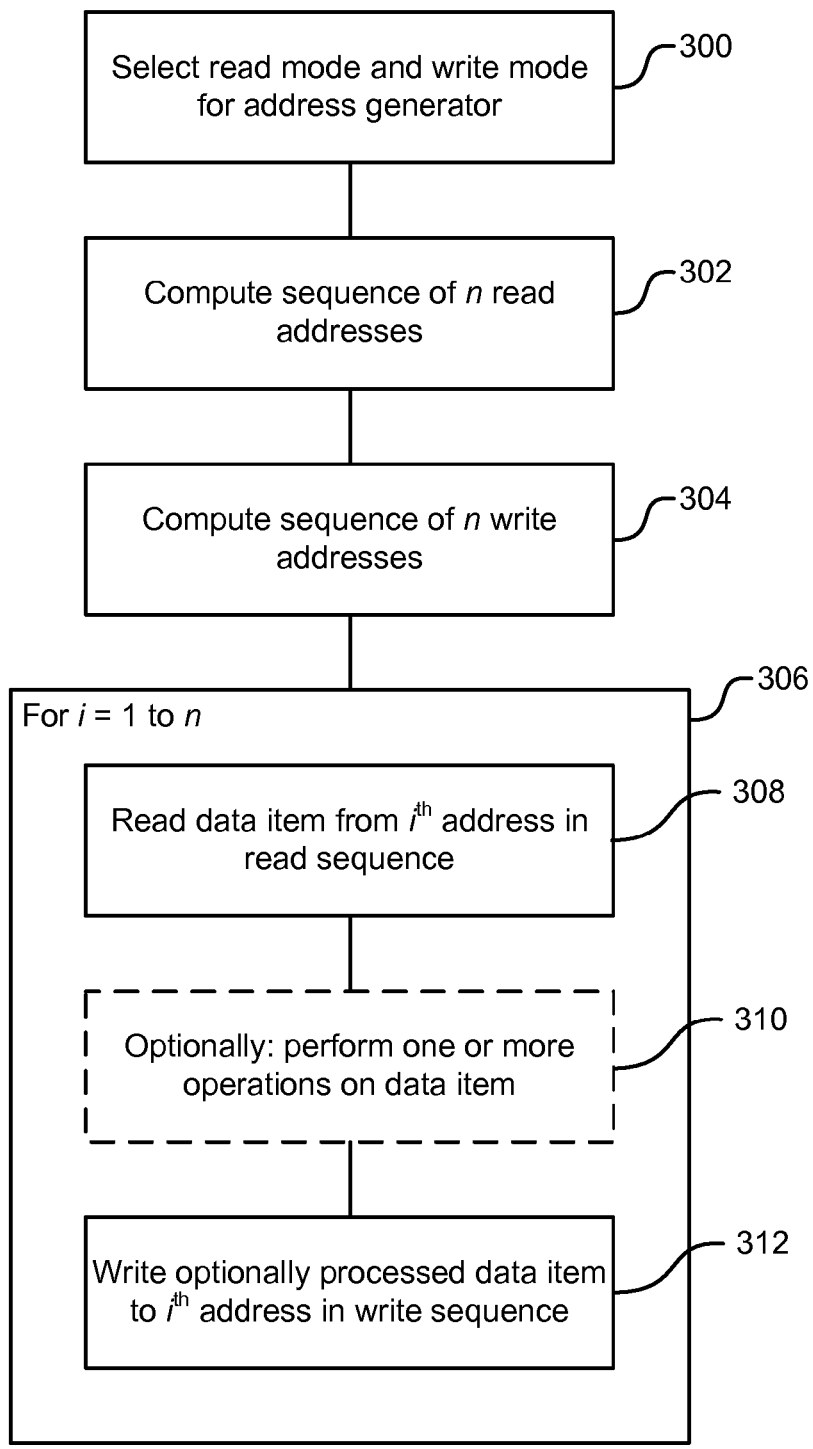
FIG. 3 illustrates a flowchart of a process for non-linear address generation.

Reference is now made to FIG. 3, which illustrates a flowchart of a more general process for re-ordering data items using the address generator. In this example, the data items are being read from the on-chip memory 102 and written back to the on-chip memory 102 in a different sequence. In other examples the data may be read from paged memory 112 and/or it may be written to paged memory 112. In step 300 a read mode and a write mode for the configurable address generator 210 is selected. As noted above, the selection of the read and write mode can be made using the general control processor 110 according to a configuration program, and a command or signal passed to the address generator.

In step 302, the address generator 210 computes a sequence of n read addresses according to the read mode selected, where n is the number of data items being transferred in this sequence. Note that although n data items are being transferred, there may be more or fewer distinct data items present (i.e. one or more data items may get transferred more than once, or not at all). In step 304, the address generator 210 computes a sequence of n write addresses according to the write mode selected. One or both of the read and write address sequences can be computed as a non-linear (i.e. non-consecutive or non-contiguous) sequence. Various example algorithms for calculating the read and/or write address sequences are presented below.

In step 306, the DMA controller 106 loops through each of the n addresses in the read and write sequences in turn, and performs the operations within the box of FIG. 3 at each iteration i. For the first iteration, the DMA controller 106 reads the data item addressed by the first address in the read sequence from the on-chip memory 102 (via the internal port 202) in step 308. One or more optional operations can then be performed on the data item read in step 310. For example, the data item can be provided to a hardware peripheral 108 to be processed (via the peripheral ports 206), or it may be provided to a number of hardware peripherals connected such that the output of one peripheral is connected to the input of another peripheral. In step 312, the data item (or the data item processed by one or more hardware peripherals) is written back to the on-chip memory 102 (via the internal port 202) to the first memory address in the write sequence. Steps 308 to 312 then repeat for each of the subsequent $i^{th}$ addresses in the read and write sequence, until the process iterates through all n addresses.

Note that the steps shown in FIG. 3 do not need to be performed such that an individual data item is read out then written back before another data item is read. Rather, some or all of the data items can be read from the on-chip memory 102 as a group (and then optionally processed), and then written back to the on-chip memory 102 as a group.

The process of FIG. 3 therefore enables the data items on the on-chip memory 102 to be reordered into a different sequence as an integral part of a memory transfer operation. This can be used to implement interleaving or de-interleaving, by generating the read/write address sequences according to an interleaving scheme. Using the process of FIG. 3, interleaving of data items stored on the on-chip memory 102 can be performed by reading the data items from their locations on the on-chip memory 102 according to read sequence, and writing them back to the on-chip memory 102 according to write sequence to different locations on the on-chip memory 102 in the interleaved order. Alternatively, the data items may be read from the paged memory according to the read sequence and/or the data items may be written to the paged memory according to the write sequence. Presented below are several example algorithms or modes that the address generator 210 can be configured to implement in order to generate the read and/or write sequences. The address generator is not limited to these modes, and any other suitable address generation can be used, as will be apparent to the skilled person. These example modes/algorithms can also be combined in any suitable manner.

Row-Column Mode

Figure 4:
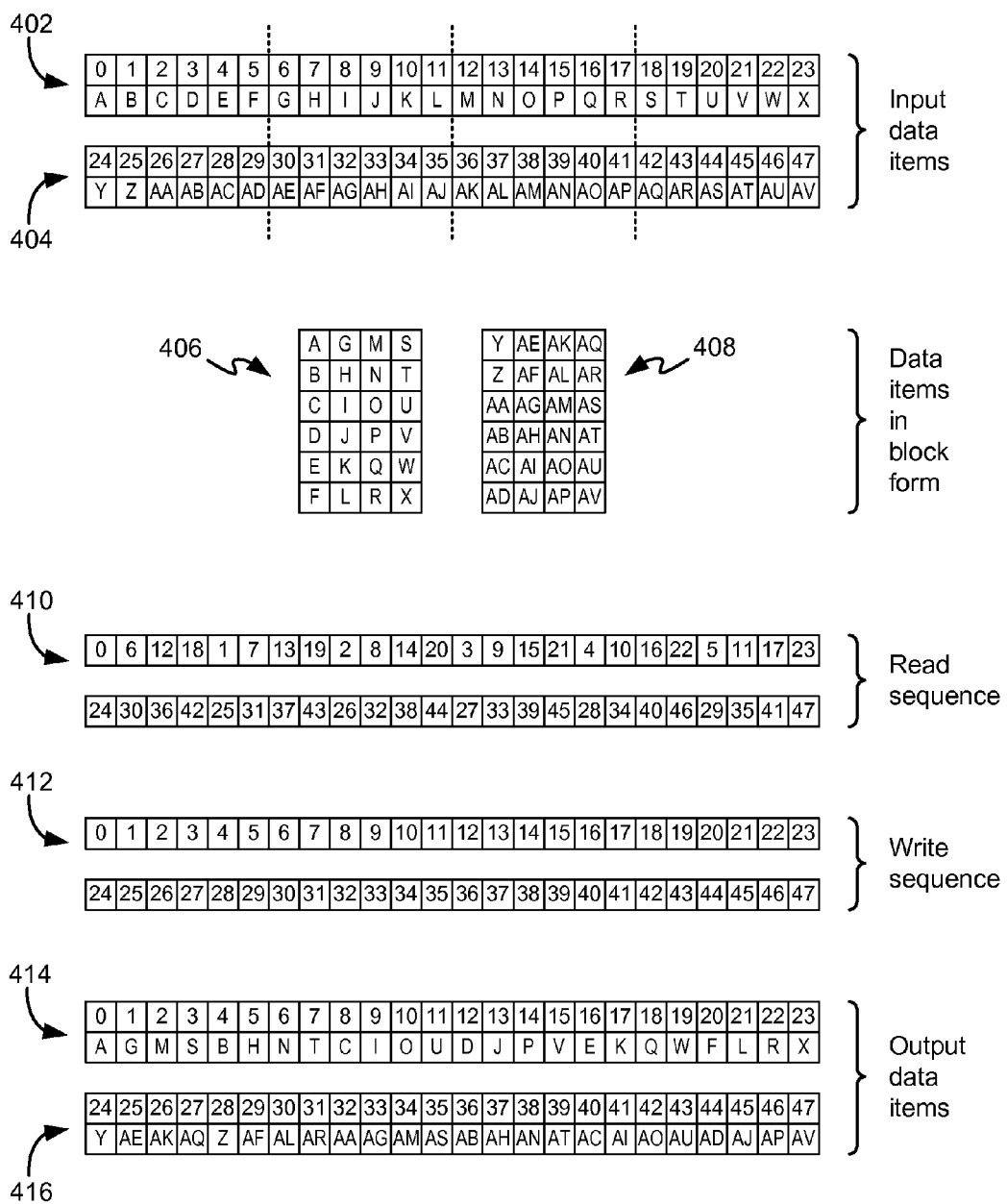
FIG. 4 illustrates an example of row-column operations performed on two blocks of data using the DMA controller.

The first mode is called a row-column mode. The row-column mode considers the data items in the first sequence to be arranged in one or more grids or tables having a plurality of rows and columns. This is illustrated in FIG. 4, which shows a first block of input data items 402, which (for illustrative purposes only) have contiguous memory addresses from 0 to 23, and a second block of input data items 404 which (again for illustrative purposes only) have contiguous memory addresses from 24 to 47. In this example, the data items are considered to have column breaks every six data items, as indicated by the dashed lines in FIG. 4. This means that the consecutive memory addresses are considered to be arranged along the columns of a grid having six rows.

The data items presented in grid form are shown in FIG. 4, which shows a first grid 406 for the first block of input data items 402 and a second grid 408 for the second block of input data items 404. Both the first and second grids have six rows and four columns. It can be noted that consecutively addressed data items are arranged along the columns. However, in other examples, the data items can also be presented such that consecutive items are arranged along the rows instead, in which case the description below still applies but with references to rows and columns reversed.

The purpose of the row-column mode is to transpose each grid, such that when the input data items are arranged in the sequence traversing the columns of the grid, the output data items are arranged in the sequence traversing the rows of the grid. For example, referring to grid 406, if the first four data items of the input data sequence are A, B, C, D (reading four items down the first column), then the first four data items of the output data sequence are A, G, M, S (reading four items along the first row). A row-column operation such as this therefore changes the order of data items in dependence on how many rows are defined as being present in the grid. This type of operation is frequently performed for interleaving and deinterleaving.

In order to implement the row-column mode, the address generator 210 generates a read and a write sequence that results in the row-column transposition. This can be achieved by generating a non-linear read sequence and a linear write sequence (as illustrated in FIG. 4 and described in more detail below), or by generating a linear read sequence and a non-linear write sequence. In further examples, non-linear read sequence and non-linear write sequences can also be used in order to enable efficient memory access as described below with reference to FIG. 5.

FIG. 4 shows the example of a non-linear read sequence 410, which can be seen to comprise non-consecutive memory addresses. In one example, the address sequence can be generated using an algorithm illustrated by the following pseudocode:

```
N0 = rows * columns;
N1 = rows;
N2 = numBlocks * rows * columns;
For ind = 1 to numItems
    nextItemAddr = a + o;
    a = a + N1;
    if a >= N0
        a = a - N0 + 1;
        b = b + 1;
        if b >= N1
            a = 0;
            b = 0;
            = rem(o + N0, N2);
        end
    end
end
```

Where "rows" is the number of rows in the grid (six in the FIG. 4 example), "columns" is the number of columns in the grid (four in the FIG. 4 example), "numBlocks" is the number of blocks of data items (two in the FIG. 4 example), and "numItems" is the total number of data items over all blocks (48 in the FIG. 4 example). Variables "a", "b" and "o" are internal variables used within the algorithm that may be all initialised to zero or one or more may be set to a non-zero value in order to apply an offset.

After calculating the initial values for N0, N1 and N2, the algorithm iterates through the number of data items present, calculating the next address in the sequence ("nextItemAddr") at each iteration. Effectively, the algorithm skips a fixed number of data items from the input sequence (e.g. six in FIG. 4) until the end of a row is reached (determined by the first "if" statement), and then increments the starting point for that row by one and repeats. The end of a block is detected by the second "if" statement, which resets the calculations but adds an offset calculated from the remainder operation, rem(.) (24 in FIG. 4). The process then repeats until "numItems" is reached. Note that "numItems" can be set to a value larger than the total number of data items present, and, if so, the algorithm wraps back to the first block once all the blocks have been accessed.

The read sequence 410 generated by the above algorithm is shown in FIG. 4, with the top row showing the sequence for the first block (grid 406) and the bottom row showing the sequence for the second block (grid 408). Taking the first four items of the read sequence 410 as an example, these read from addresses 0, 6, 12, 18, which correspond to data items A, G, M, S from the input data items 402. This can be seen to correspond to the first row of grid 406.

The address generator 210 generates a linear write sequence 412 having consecutive memory addresses, such that when the read sequence 410 and write sequence 412 are used by the DMA controller 106 the data items are read in a non-linear sequence and written in a linear sequence. Note that the write sequence in FIG. 4 has addresses from 0 to 47 for simplicity, but in other examples the addresses can start from any base address. The DMA controller may read all the data items from one block before writing them back to the same region of memory. In an alternate mode of operation the DMA controller may read one item from memory and write that item back to a different region of memory before reading the next data item. In this alternate mode of operation the base address of the write sequence is different to the base address of the read sequence. The result of the combination of the read sequence 410 and write sequence 412 can be seen in the first block of output data items 414 and the second block of output data items 416. By comparing these output data items to grid 406 and 408, it can be seen that a row-column operation has been successfully performed.

The same result can also be obtained by generating a linear read sequence and a non-linear write sequence, as follows (only the first block is shown for brevity):

Read Sequence:

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|----|----|----|----|----|----|----|----|----|----|----|----|----|----|

Write Sequence:

| 0 | 4 | 8 | 12 | 16 | 20 | 1 | 5 | 9 | 13 | 17 | 21 | 2 | 6 | 10 | 14 | 18 | 22 | 3 | 7 | 11 | 15 | 19 | 23 |
|---|---|---|----|----|----|---|---|---|----|----|----|---|---|----|----|----|----|---|---|----|----|----|----|

The non-linear write sequence can be generated using similar techniques to the non-linear read sequence described in detail above. The examples above illustrate how the configurable address generator 210 can be used to implement an interleaving operation such as a row-column swap on a set of data items. This type of operation can be used, for example, to read a block of data items from the on-chip memory and write the data items back to the on-chip memory in a transposed order, thereby deinterleaving the data.

Burst Row-Column Mode

The second mode is a variant on the row-column mode that again considers the data to be arranged in a grid having rows and columns. However, rather than just reading one data item from each column whilst traversing along the row (as in the row-column case) the burst row-column mode reads a predefined number of consecutive addresses before skipping to the next column along the row. For example, referring to grid 406 of FIG. 4, if the burst length is three, then the burst row-column mode firstly reads three consecutive items in one burst (items A, B, C), then moves along the row and reads the next three consecutive items (G, H, I), followed by M, N, O, and then S, T, U. It then wraps backs to the first column and reads D, E, F, followed by J, K, L, etc. The burst row-column mode can therefore be considered to be the same as the row-column mode, except that a group of consecutive data items are read, rather than just one.

A read sequence for the burst row-column mode can, in one example, be generated using an algorithm illustrated by the following pseudocode:

```
N0 = burstLength;
N1 = rows;
N2 = rows * columns - burstLength;
For ind = 1 to numItems
    nextItemAddr = a + o;
    a = a + 1;
    if a >= N0
        a = 0;
        o = o + N1;
        if o >= N2 + N1
            o = 0;
        elseif o >= N2 + N0
            o = o - N2;
        end
    end
end
```

The variables are defined as above for the row-column mode. "burstLength" is the number of consecutive or contiguous items to read in each burst. Note that write sequences for a burst row-column operation can also be generated in a similar manner.

Figure 5:
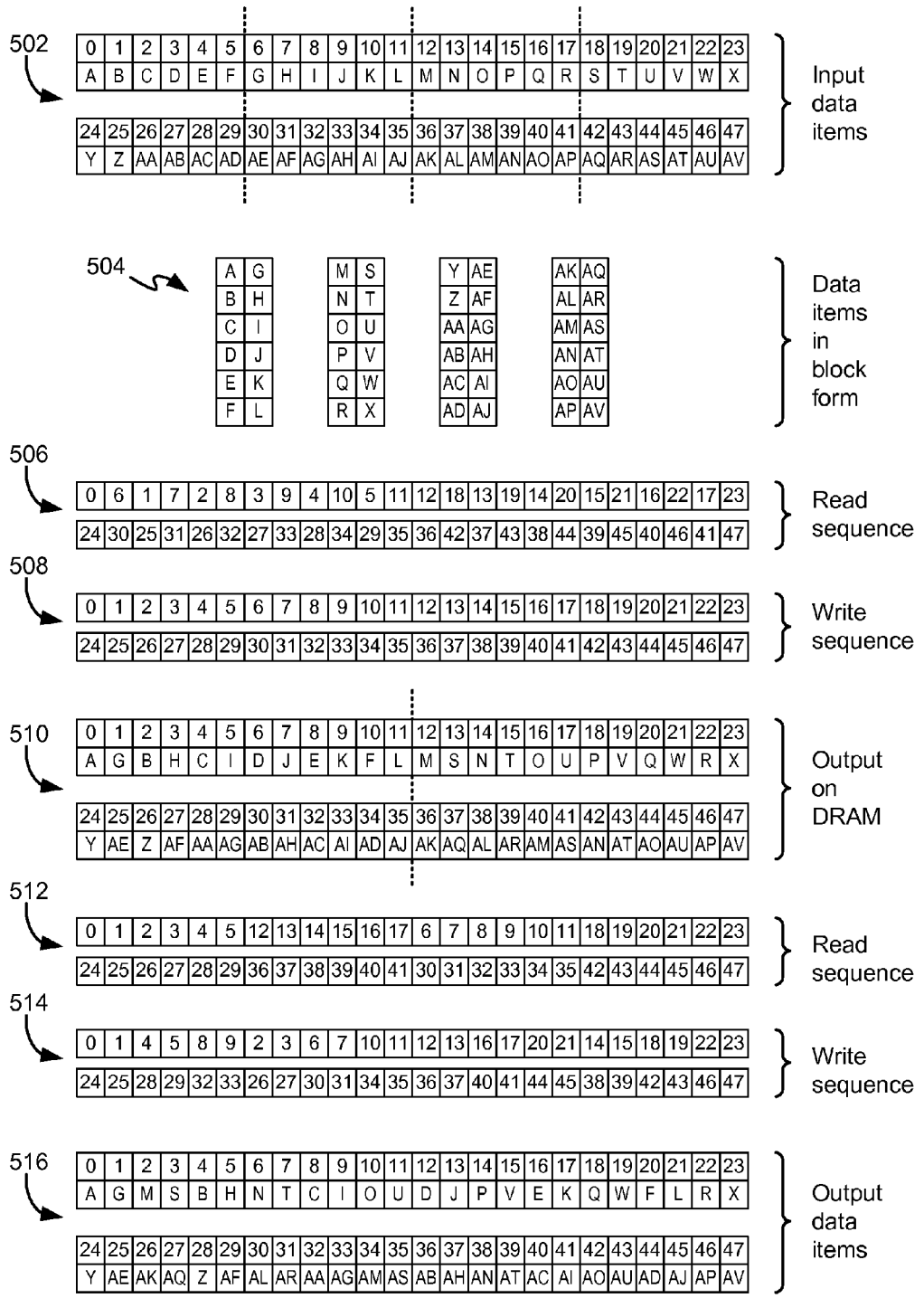
FIG. 5 illustrates an example of the row-column operation of FIG. 4 with enhancements to counteract the limitations of DRAM devices.

The burst row-column mode can be used to enable interleaving operations to be performed efficiently with certain types of memory device, as outlined with reference to FIG. 5. For example, the paged memory device 112 may be a DRAM device. DRAM devices organise their stored content in pages, each typically a few thousand bytes in size, and each DRAM can only have a limited number of pages open at one time (typically four). Many overhead cycles are needed to open a page to access data, so patterns of data access that frequently access different pages can be inefficient. Many interleaver access patterns attempt to consecutively access widely spaced apart data items, leading to inefficient memory access with DRAM devices.

For example, the row-column operation of FIG. 4 reads consecutive data items that are spaced apart by the number of rows in the grid. In examples where a large number of rows are present, this can result in accesses that are widely spaced apart across the memory device, resulting in inefficient accesses from different DRAM pages.

FIG. 5 illustrates an example of how the configurable address generator can be used to implement a row-column swap operation without incurring the inefficiencies of DRAM access associated with frequently accessing different pages or partially filling bursts. The example of FIG. 5 generates the same row-column result as that in FIG. 4 (i.e. a swap with six rows, four columns and two blocks), but does so using many runs of linear sequential memory accesses that result in efficient operation of a paged device like DRAM. In the example of FIG. 5, the DMA controller is reading a sequence of input data items from the on-chip memory 102, storing the data items on the paged memory device 112 (DRAM) and then reading the data items back from the DRAM and writing them to the on-chip memory 102 (potentially overwriting their original locations) with the rows and columns swapped.

The input data items 502 are the same as those used in the example of FIG. 4. There are a total of 48 data items having a consecutive sequence of memory addresses starting from zero. Firstly, the data items are read from the on-chip memory 102 in row-column mode with six rows and two columns per block. Blocks 504 shows the data items arranged in blocks having six rows and two columns per block. A read sequence 506 to read along the rows of each of these blocks in turn is generated by the address generator 210 as described above. A linear write sequence 508 is also generated by the address generator 210. The DMA controller 106 reads from the on-chip memory 102 using the read sequence 506, and writes to the paged memory device 112 using the write sequence 508. The writing to DRAM in this manner is not inefficient, as it is writing linearly to contiguous addresses, and therefore will only occasionally cross a DRAM page boundary if the number of data items is sufficient.

As a result of this operation, the data items on DRAM 510 can be seen to correspond to a row-column swap from the blocks 504. A DRAM read sequence 512 is then generated by the address generator 210 that reads these data items back from the DRAM. This read sequence is generated using the burst row-column mode, and is configured to avoid inefficient access. The burst row-column mode in this example uses six items per burst, twelve rows and two columns. Because the DRAM read sequence 512 reads bursts of data items, these are located at consecutive addresses on the DRAM, and hence are unlikely to cross page boundaries and will also make efficient use of the bursts available on the DRAM interface (especially if the address generator burst size is close to the DRAM interface burst size). Therefore, significantly fewer page boundaries will be crossed relative to a (non-burst) row-column access.

A non-linear write sequence 514 is also generated to write the data items back to the on-chip memory 102. This write sequence 514 is also generated using the burst row-column mode, and in this example uses two items per burst, four rows and three columns. The combination of the read sequence 512 and the write sequence 514 is such that the output data items 516 written back to the on-chip memory 102 are in the same sequence as if a basic row-column operation with six rows, four columns and two blocks were performed (this can be compared to FIG. 4), except that the data was stored on a DRAM without incurring inefficiencies due to page boundaries and incomplete bursts. Furthermore, because the initial read from the on-chip memory 102 used a row-column operation with blocks of only two columns, this enables the transfer of data to the DRAM to begin as soon as one whole block has arrived at the on-chip memory 102, which is sooner than if a four column block is used as in FIG. 4. This can improve performance in the case of real-time data, where the data is arriving in a stream over time.

Twisted Row-Column Mode

This mode is a variant on the row-column mode that again considers the data to be arranged in a grid having rows and columns. However, rather than just traversing along each row, each column is cyclically shifted by a column-dependent offset. In other words, the generated sequence is based on a row-column transpose of the grid with a position shift applied to the elements of one or more columns or rows.

A read sequence for the burst row-column mode can, in one example, be generated using an algorithm illustrated by the following pseudocode:

```
N0 = burstLength;
N1 = rows;
N2 = rows * columns;
offset = getNextOffset( );
For ind = 1 to numItems
    nextItemAddr = o + rem(a + b + offset, N1);
    a = a + 1;
    if a >= N0
        a = 0;
        o = o + N1;
        offset = getNextOffset( );
        if o >= N2
            o = 0;
            b = b + N0;
            if b >= N1
                b = 0;
            end
        end
    end
end
```

The variables are defined as above for the row-column mode and burst row-column mode. The "offset" variable defines how much a column is shifted by. The values taken by the "offset" variable can be in the form of a vector, which contains offset values for each column. "getNextOffset( )" is a function that fetches the next value from the vector of offset values.

As an example, consider the following sequence of data items, where the top row shows the memory address of the corresponding data item in the row below:

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| A | B | C | D | E | F | G | H | I | J | K  | L  | M  | N  | O  |

The address generator 210 can, for example, generate a twisted row-column read sequence having five rows, three columns, a burstLength of one, and an offset vector of [0, 1, 2] (i.e. column 1 has a zero offset, column 2 has an offset of one, and column 3 has an offset of two).

A row-column operation without twist (such as that shown in FIG. 4) represents the data items on a five-row, three-column grid as follows:

| A | F | K |
|---|---|---|
| B | G | L |
| C | H | M |
| D | I | N |
| E | J | O |

When the offsets above are applied to the columns, this means that the data items in column 1 are shifted downwards by one, and the data items in column 2 are shifted downwards by two. This gives the following grid representation:

| A | J | N |
|---|---|---|
| B | F | O |
| C | G | K |
| D | H | L |
| E | I | M |

The read sequence for this example twisted row-column operation can be generated by an algorithm such as the above pseudocode, and is as follows:

| 0 | 9 | 13 | 1 | 5 | 14 | 2 | 6 | 10 | 3 | 7 | 11 | 4 | 8 | 12 |
|---|---|----|---|---|----|---|---|----|---|---|----|---|---|----|

When combined with a linear write sequence, this results in the following sequence being written:

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| A | J | N | B | F | O | C | G | K | D | H  | L  | E  | I  | M  |

This can be seen to correspond to traversing along the rows of the offset grid shown above.

Note that twisted row-column operations can also be applied to write sequences. Furthermore, the offsets can be arranged to shift the data items up or down the columns. In further examples, the data items can be considered to arrange consecutive items along rows instead of columns in the examples above, in which case the references to rows and columns in the above description are reversed.

FIFO Mode

This mode implements a set of first in first out (FIFO) queues of different lengths. FIFOs like this can be used to implement a convolutional deinterleaver. With convolutional deinterleaving, incoming data items are cyclically placed on each of the different length FIFOs in turn, and the outgoing data items are formed by cyclically reading off each FIFO in turn. The different lengths of the FIFO effectively introduce a different delay for the data items to pass through each FIFO. Convolutional deinterleavers are used, for example, to reorder data before Reed-Solomon decoding in the DVB-T broadcast standard.

The FIFO mode can, in one example, generate a write sequence using an algorithm illustrated by the following pseudocode:

```
N0 = itemsPerFIFO;
N1 = numFIFOs;
N2 = structureSize;
offset = getNextOffset( );
For ind = 1 to numItems
    nextItemAddr = rem(a + o + offset, N2);
    a = a + 1;
    if a >= N0
        a = 0;
        b = b + 1;
        offset = getNextOffset( );
        if b >= N1
            b = 0;
            o = rem(o + N0, N2);
        end
    end
end
```

The variables are defined as above. In addition, the data items in the FIFOs are stored in a block of memory of size "structureSize" The "offset" variable defines the memory address at which a FIFO is located. The values taken by the "offset" variable can be in the form of a vector, which contains offset values for each FIFO. "getNextOffset( )" is a function that fetches the next value from the vector of offset values. "itemsPerFIFO" defines the number of data items written to each FIFO before moving on to the next FIFO.

The above pseudocode iterates through the data items, and defines the memory addresses within the block of memory representing the FIFOs to which each of the data items should be stored. The data DMA controller uses the addresses generated by this pseudocode to write the data items cyclically into the FIFOs. To implement a convolutional deinterleaver, the data DMA controller uses the addresses generated by another similar algorithm to read the data out of these FIFOs, but uses different offsets for the FIFOs in the memory in order to create the delays.

As an example, consider the following sequence of data items:

| 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|----|----|----|----|----|----|----|----|
| A | B | C | D | E | F | G | H | I | J | K  | L  | M  | N  | O  | P  | Q  | R  |

A sequence of write addresses is generated using the FIFO mode described above, using three FIFOs of length 1, 2 and 3 (i.e. an offset vector of [0, 2, 5]) and an itemsPerFIFO of one:

| 0 | 2 | 5 | 1 | 3 | 0 | 2 | 4 | 1 | 3 | 5 | 2 | 4 | 0 | 3 | 5 | 1 | 4 |
|---|---|---|---|---|---|---|---|---|---|---|---|---|---|---|---|---|---|

A sequence of read addresses is generated using the FIFO mode described above, using three FIFOs of length 1, 2 and 3 (i.e. an offset vector of [0, 1, 3]) and an itemsPerFIFO of one:

| 0 | 1 | 3 | 1 | 2 | 4 | 2 | 3 | 5 | 3 | 4 | 0 | 4 | 5 | 1 | 5 | 0 | 2 |
|---|---|---|---|---|---|---|---|---|---|---|---|---|---|---|---|---|---|

The memory representing the FIFOs contains the data items as shown below after each group of 3 data items have been written and read:

| 0  | 1  | 2  | 3  | 4  | 5  |
|----|----|----|----|----|----|
| xx | xx | xx | xx | xx | xx |
| A  | xx | B  | xx | xx | C  |
| F  | D  | B  | E  | xx | C  |
| F  | I  | G  | E  | H  | C  |
| F  | I  | L  | J  | H  | K  |
| N  | I  | L  | O  | M  | K  |
| N  | Q  | L  | O  | R  | P  |

This results in an output data sequence of:

| 0 | 1  | 2  | 3 | 4 | 5  | 6 | 7 | 8 | 9 | 10 | 11 | 12 | 13 | 14 | 15 | 16 | 17 |
|---|----|----|---|---|----|---|---|---|---|----|----|----|----|----|----|----|----|
| A | XX | XX | D | B | XX | G | E | C | J | H  | F  | M  | K  | I  | P  | N  | L  |

This corresponds to a convolutional deinterleaving operation. Note that "XX" represents an invalid data item, e.g. caused by the FIFO having no data at that point due to the delay. This mode shows how the address generator 210 can be used to write data to a block of memory as if it was being stored in a set of dedicated FIFOs, and read it back from this block of memory to implement a convolutional deinterleaver. This therefore achieves convolutional deinterleaving using shared memory without dedicated buffers.

Modulo Mode

This mode calculates a read or write sequence based on the modulo of a start address and a predefined integer. For example, this can be illustrated using the following pseudocode.

```
N0 = modulo;
N1 = increment;
N2 = startAddr;
For ind = 1 to numItems
    nextItemAddr = rem(a + N2, N0);
    a = rem(a + N1, N0);
end
```

The variables are defined as above. In addition, "modulo" is the predefined integer used in the modulo calculations (using the rem(.) function). "increment" defines an amount by which the address sequence skips between value, and "startAddr" defines a start address within the input data items from which the sequence begins.

For example, consider the following input data item sequence (with addresses on the top line, and data items on the bottom line):

| 0 | 1 | 2 | 3 | 4 | 5 | 6 |
|---|---|---|---|---|---|---|
| A | B | C | D | E | F | G |

If example values of modulo=7, increment=3, and startAddr=2 are taken, then this mode generates a read sequence of:

| 2 | 5 | 1 | 4 | 0 | 3 | 6 |
|---|---|---|---|---|---|---|

Combined with a linear write sequence, the data item sequence written out is then:

| 0 | 1 | 2 | 3 | 4 | 5 | 6 |
|---|---|---|---|---|---|---|
| C | F | B | E | A | D | G |

Note that modulo operations can also be applied to write sequences.

Row-Column Convolutional Deinterleaver Mode

This mode implements a convolutional deinterleaver (similar to that implemented using the FIFO mode above) using a variant of row-column addressing. This mode generates a read sequence that emulates the reading of the data items from FIFOs as outlined above. The data stored from this read sequence can then be read out using the modulo mode outlined above in order to implement convolutional deinterleaving.

This mode can be illustrated using the following pseudocode:

```
N0 = numFIFOs;
N1 = rem((d1-d0) * numFIFOs + buffLen, buffLen);
N2 = buffLen;
For ind = 1 to numItems
    nextItemAddr = rem(a + b + o, N2);
    a = rem(a + N1, N2);
    b = b + 1;
    if b >= N0
        a = 0;
        b = 0;
        o = rem(o + N0, N2);
    end
end
```

In the above pseudocode, "numFIFOs" defines the number of FIFOs that would be present in the convolutional deinterleaver being implemented, "d1" is the delay applied to FIFO 1, and "d0" is the delay applied to FIFO 0. "buffLen" is the length, in data items, of the input sequence. The remaining variables are defined as above. This algorithm generates a read sequence that reads data items as if the data items had been alternately placed in two or more separate FIFOs (e.g. the first data item in FIFO 0, the second in FIFO 1, the third in FIFO 2 etc.) However, the algorithm reads from further along the sequence for those data items that are considered to be in FIFOs having delays. This is illustrated with the following example.

Consider the following sequence of input data items (with addresses on the top line, and data items on the bottom line):

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|----|----|----|----|----|----|----|----|----|----|----|----|----|----|
| A | B | C | D | E | F | G | H | I | J | K  | L  | M  | N  | O  | P  | Q  | R  | S  | T  | U  | V  | W  | X  |

If these data items were to be alternately stored on three FIFO buffers, then these would be held as follows:

| FIFO0: | A | D | G | J | M | P | S | V |
| FIFO1: | B | E | H | K | N | Q | T | W |
| FIFO2: | C | F | I | L | O | R | U | X |

Using the above algorithm, if numFIFOs=3, buffLen=24, and (d1−d0)=2 (i.e. a delay of two between adjacent FIFOs), then the following read sequence is generated:

| 0 | 7 | 14 | 3 | 10 | 17 | 6 | 13 | 20 | 9 | 16 | 23 | 12 | 19 | 2 | 15 | 22 | 5 | 18 | 1 | 8 | 21 | 4 | 11 |

When written with a linear write sequence, this gives rise to the following output data sequence:

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|----|----|----|----|----|----|----|----|----|----|----|----|----|----|
| A | H | O | D | K | R | G | N | U | J | Q  | X  | M  | T  | C  | P  | W  | F  | S  | B  | I  | V  | E  | L  |

Rearranging this sequence to show the three FIFOs gives the following pattern—

| FIFO0: | A | D | G | J | M | P | S | V |
|--------|---|---|---|---|---|---|---|---|
| FIFO1: | H | K | N | Q | T | W | B | E |
| FIFO2: | O | R | U | X | C | F | I | L |

It can be seen that this sequence alternates between a data item from each FIFO, with the delays applied. For example, the first data item "A" is the first item in FIFO0, the second data item "H" is the data item in FIFO1 with a shift of two applied, the third data item "O" is the data item in FIFO2 with a shift of four applied, and so on.

This mode enables the address generator to implement convolutional deinterleaving using a minimum number of memory-to-memory transfers, and without the use of dedicated FIFO buffers. Note that this mode can also generate write sequences in a similar manner.

Repeat-Skip Mode

This mode generates a read sequence that comprises a linear sub-sequence of contiguous memory addresses repeated a predetermined number of times. After repeating the predefined number of times, the memory address is moved on by a defined amount, and the process starts again. Example pseudocode for illustrating this is as follows:

```
N0 = sequenceLength;
N1 = sequenceRepeats;
N2 = sequenceLength + itemsToSkip;
For ind = 1 to numItems
    nextItemAddr = a + o;
    a = a + 1;
    if a >= N0
        a = 0;
        b = b + 1;
        if b >= N1
            b = 0;
            o = o + N2;
        end
    end
end
```

The variable "sequenceLength" defines how long (in memory addresses) the contiguous sub-sequence is, "sequenceRepeats" defines the number of times the sub-sequence is repeated, "itemsToSkip" defines how many data items are skipped when each sub-sequence repeat is completed. The remaining variables are defined as above.

For example, for the following input data sequence (with addresses on the top line, and data items on the bottom line):

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| A | B | C | D | E | F | G | H | I | J | K  | L  | M  | N  | O  | P  |

If sequenceLength=4, sequenceRepeats=2, and itemsToSkip=3, then this generates the following read sequence:

| 0 | 1 | 2 | 3 | 0 | 1 | 2 | 3 | 7 | 8 | 9 | 10 | 7 | 8 | 9 | 10 |
|---|---|---|---|---|---|---|---|---|---|---|----|---|---|---|----|

This read sequence comprises the first sub-sequence 0, 1, 2, 3 repeated twice, and then the second sub-sequence 7, 8, 9, 10 also repeated twice. The start address of the second sub-sequence (7) comes from the skip of three from the end of the previous sub-sequence. When combined with a linear write sequence, this gives the following output data sequence:

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| A | B | C | D | A | B | C | D | H | I | J  | K  | H  | I  | J  | K  |

This mode can be used, for example, to read valid data in a corrected sequence of Reed-Solomon code words, such that the parity bytes are skipped over.

Run-Length Mode

This mode generates a read sequence that comprises a first predetermined number of contiguous memory addresses and then a skip of one or more memory addresses followed a second predetermined number of contiguous memory addresses. Further blocks of predetermined numbers of contiguous memory addresses can also follow. The number of memory addresses in each block can be defined by a vector storing integer values for the block lengths. Example pseudocode to illustrate this mode is as follows:

```
N0 = skip;
offset = getNextOffset( );
For ind = 1 to numItems
    nextItemAddr = a + b + o;
    a = a + 1;
    if a >= offset
        a = 0;
        b = b + N0;
        o = o + offset;
        offset = getNextOffset( );
    end
end
```

Where "skip" defines the number of data items to skip between blocks of contiguous addresses, and "offset" is a vector containing integers defining the size of the blocks. For example, consider the following input data sequence (with addresses on the top line, and data items on the bottom line):

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|----|----|----|----|----|----|----|----|----|----|----|----|----|----|----|
| A | B | C | D | E | F | G | H | I | J | K  | L  | M  | N  | O  | P  | Q  | R  | S  | T  | U  | V  | W  | X  | Y  |

If, for example, skip=1 and offset=[2, 1, 2, 4] then the following read sequence is generated:

| 0 | 1 | 3 | 5 | 6 | 8 | 9 | 10 | 11 | 13 | 14 | 16 | 18 | 19 | 21 | 22 | 23 | 24 |
|---|---|---|---|---|---|---|----|----|----|----|----|----|----|----|----|----|----|

When combined with a linear write sequence, this results in the following output data sequence:

| 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|----|----|----|----|----|----|----|----|
| A | B | D | F | G | I | J | K | L | N | O  | Q  | S  | T  | V  | W  | X  | Y  |

As can be seen, this corresponds to a block of the first two contiguous data items, then a skip over one, followed by a block of one data item, a skip over one, a block of two contiguous data items, a skip over one, a block of four contiguous data items, etc.

The above-described eight modes are merely examples of the types of operations that can be performed by the configurable address generator 210 when generating read and/or write addresses for memory transfer operations. Note that many more types of operation can also be implemented and programmed to be performed by the address generator 210. Furthermore, these operations can also be combined in any suitable manner, and any reference to rows and columns can also be reversed to refer to columns and rows as appropriate. Where the above examples show the generation of a read sequence, they can also or alternatively be used to generate a write sequence or vice versa. Furthermore, although the examples show base addresses for both read and write sequences starting from zero, this is merely for clarity, and any base address can be used. In addition, the examples above show the memory addresses incrementing by one between each data item. However, in other examples the data items can be larger than a single memory location, in which case the memory address increment for each data item is larger than one.

The address generation operations performed by the configurable address generator 210 enable the digital signal processing system to perform complex, memory intensive operations such as interleaving and deinterleaving whilst still making use of common, shared memory spaces rather than dedicated interleaving buffers. Furthermore, where data items are being read out to a paged memory device, such as a DRAM, the address generator 210 can be configured to counteract inefficiencies of the memory device, and improve memory transfer performance.

The term "processor" and "computer" is used herein to refer to any device with processing capability such that it can execute instructions. Those skilled in the art will realize that such processing capabilities are incorporated into many different devices and therefore the term "computer" includes set top boxes, media players, digital radios, PCs, servers, mobile telephones, personal digital assistants and many other devices.

Those skilled in the art will realize that storage devices utilized to store program instructions or data can be distributed across a network. For example, a remote computer may store an example of a process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, programmable logic array, or the like.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to "an" item refers to one or more of those items. The term "comprising" is used herein to mean including the method blocks or elements identified, but that such blocks or elements do not comprise an exclusive list and an apparatus may contain additional blocks or elements and a method may contain additional blocks or operations. Additionally, the elements or operations recited in a given claim may themselves implement functions and/or have structures that are not specifically recited in the claim, and thus, the term "comprising", unless indicated otherwise explicitly, allows for such.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of the examples.

The invention claimed is:

1. A digital signal processing system-on-chip, comprising:
a first memory storing a plurality of data items arranged in a first sequence, each data item having an associated memory address on the first memory;
at least one digital signal processor coupled to the first memory and arranged to read and write data directly to the first memory; and
a direct memory access controller coupled to the first memory, and including
a port to a paged memory device, and
a configurable address generator arranged to compute a sequence of read addresses according to a selected one of a plurality of different read modes and to compute a sequence of write addresses according to a selected one of a plurality of different write modes;
wherein the computed sequence of read addresses and the computed sequence of write addresses are combined such that the direct memory access controller is configured to transfer the plurality of data items directly from the first memory to the paged memory device using the computed sequence of read addresses and the computed sequence of write addresses such that the data items written to the paged memory device during the transfer are arranged in a second sequence that is different from the first sequence, and
wherein a read mode is a pattern in which data items are read from memory in a single transaction and a write mode is a pattern in which data items are written to memory in a single transaction.

2. A digital signal processing system-on-chip according to claim 1, wherein the selected one of the plurality of read modes is arranged to configure the address generator to cause the direct memory access controller to read the data items from a non-linear sequence of memory addresses on the first memory, and the selected one of the plurality of write modes is arranged to configure the address generator to cause the direct memory access controller to write the data items to a linear sequence of addresses on the paged memory device.

3. A digital signal processing system-on-chip according to claim 1, wherein the selected one of the plurality of read modes is arranged to configure the address generator to cause the direct memory access controller to read the data items from a linear sequence of memory addresses on the first memory, and the selected one of the plurality of write modes is arranged to configure the address generator to cause the direct memory access controller to write the data items to a non-linear sequence of addresses on the paged memory device.

4. A digital signal processing system-on-chip according to claim 1, wherein the selected one of the plurality of read modes is arranged to configure the address generator to cause the direct memory access controller to read the data items from a non-linear sequence of memory addresses on the first memory, and the selected one of the plurality of write modes is arranged to configure the address generator to cause the direct memory access controller to write the data items to a non-linear sequence of addresses on the paged memory device.

5. A digital signal processing system-on-chip according to claim 1, wherein the direct memory access controller is further configured to transfer the plurality of data items directly from the paged memory device to the first memory, and the address generator is arranged to compute a further sequence of read addresses according to a further selected one of a plurality of read modes and a further selected one of a plurality of write modes, such that the data items written to the first memory during the transfer from the paged memory device to the first memory are arranged in a third sequence that is different from the first and second sequence.

6. A digital signal processing system-on-chip according to claim 1, wherein the paged memory device is a dynamic random access memory.

7. A digital signal processing system-on-chip according to claim 1, wherein the first memory is a static random access memory.

8. A digital signal processing system-on-chip according to claim 1, further comprising a control processor arranged to execute a program configured to select the one of the plurality of read modes and the one of the plurality of write modes for use by the address generator and provide these selections to the address generator.

9. A digital signal processing system-on-chip according to claim 1, wherein the digital signal processing system further comprises a plurality of hardware peripherals, each connected to the direct memory access controller and each configured to read data from the first memory via the direct memory access controller, perform one or more operations on the data, and write data to the first memory device via the direct memory access controller.

10. A digital signal processing system-on-chip according to claim 1, wherein the plurality of data items in the first sequence are defined as being arranged as a grid having a plurality of rows and columns.

11. A digital signal processing system-on-chip according to claim 1, wherein the plurality of data items in the first sequence are defined as being arranged as a grid of elements having a plurality of rows and columns, each element comprising a group of consecutive data items from the first sequence.

12. A digital signal processing system-on-chip according to claim 10, wherein the selected one of the plurality of read modes and the selected one of the plurality of write modes together configure the address generator to manipulate the memory address of each data item such that the second sequence is based on a transpose of the grid.

13. A digital signal processing system-on-chip according to claim 10, wherein the selected one of the plurality of read modes and the selected one of the plurality of write modes together configure the address generator to manipulate the memory address of each data item such that the second sequence is based on a transpose of the grid with a position shift applied to the elements of one or more columns or rows.

14. A digital signal processing system-on-chip according to claim 1, wherein the selected one of the plurality of read modes and the selected one of the plurality of write modes together configure the address generator to manipulate the memory address associated with each data item during the transfer such that the second sequence is equivalent to at least a portion of a convolutional deinterleaving operation performed on the first sequence.

15. A method of performing an interleaving or deinterleaving operation in a digital signal processing system using a direct memory access controller comprising a configurable address generator, wherein the direct memory access controller is coupled to a memory storing a plurality of data items arranged in a first sequence, each data item having an associated address on the memory, the method comprising:
  selecting a combination of one of a plurality of different read modes and one of a plurality of different write modes for the address generator;
  computing, at the address generator, a sequence of memory read addresses according to the selected read mode, and a sequence of memory write addresses according to the selected write mode, such that there is a non-linear relationship between the read addresses and the corresponding write addresses;
  reading, using the direct memory access controller, the data item associated with the first address in the sequence of read addresses;
  writing, using the direct memory access controller, that data item to the first address in the sequence of write addresses; and
  repeating said reading and writing for each subsequent address in the sequence of read addresses and write addresses, such that the data items are arranged in a second sequence on the memory that is different from the first sequence;
  wherein a read mode is a pattern in which data items are read from memory in a single transaction and a write mode is a pattern in which data items are written to memory in a single transaction.

16. A method according to claim 15, wherein the memory is system-on-chip memory.

17. A method according to claim 15, further comprising, subsequent to said reading and before said writing, storing the data items on a paged memory device coupled to the direct memory access controller.

18. A method according to claim 15, wherein computing a sequence of memory read addresses according to the read mode comprises one or more of:
  computing a non-linear sequence of read addresses based on a modulo of a start address and a predefined integer;
  computing a non-linear sequence of read addresses by repeating a contiguous sub-sequence of memory addresses a predetermined number of times; and
  computing a non-linear sequence of read addresses by selecting a first predetermined number of contiguous memory addresses then skipping one or more memory addresses and selecting a second predetermined number of contiguous memory addresses.

19. A method according to claim 15, wherein computing a sequence of memory write addresses according to the write mode comprises computing a non-linear sequence of write addresses based on a modulo of a start address and a predefined integer.

20. A method according to claim 15, wherein selecting a read mode and a write mode is performed by a control processor executing a program to configure the operation of the digital signal processing system.

* * * * *